United States Patent
Chidambarrao (10) Patent No.: US 7,655,511 B2
(45) Date of Patent: Feb. 2, 2010

(54) GATE ELECTRODE STRESS CONTROL FOR FINFET PERFORMANCE ENHANCEMENT

(75) Inventor: Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 11/163,908

(22) Filed: Nov. 3, 2005

(65) Prior Publication Data

US 2007/0096206 A1    May 3, 2007

(51) Int. Cl.
*H01L 29/72* (2006.01)
(52) U.S. Cl. .................. 438/150; 438/198; 257/64; 257/347; 257/401; 257/521; 257/527; 257/627; 257/628
(58) Field of Classification Search .................. 438/150, 438/198; 257/64, 347, 401, 521, 527, 627, 257/628
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |

(Continued)

FOREIGN PATENT DOCUMENTS

CN    1684271 A    10/2005

(Continued)

OTHER PUBLICATIONS

Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—Edward Wojciechowicz
(74) *Attorney, Agent, or Firm*—Scully, Scott, Murphy & Presser, P.C.; Joseph P. Abate, Esq.

(57) ABSTRACT

A finFET and its method for fabrication include a gate electrode formed over a channel region of a semiconductor fin. The semiconductor fin has a crystallographic orientation and an axially specific piezoresistance coefficient. The gate electrode is formed with an intrinsic stress determined to influence, and preferably optimize, charge carrier mobility within the channel region. To that end, the intrinsic stress preferably provides induced axial stresses within the gate electrode and semiconductor fin channel region that complement the axially specific piezoresistance coefficient.

16 Claims, 4 Drawing Sheets

U.S. PATENT DOCUMENTS

| | | | |
|---|---|---|---|
| 5,565,697 A | 10/1996 | Asakawa et al. |
| 5,571,741 A | 11/1996 | Leedy et al. |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,326,667 B1 | 12/2001 | Sugiyama et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | Von Ehrenwall |
| 6,476,462 B2 | 11/2002 | Shimizu et al. |
| 6,479,166 B1 | 11/2002 | Heuer et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,603,156 B2 | 8/2003 | Rim |
| 6,645,826 B2 | 11/2003 | Yamazaki et al. |
| 6,767,802 B1 | 7/2004 | Maa et al. |
| 6,774,015 B1 | 8/2004 | Cohen et al. |
| 6,815,278 B1 | 11/2004 | Ieong et al. |
| 6,815,738 B2 | 11/2004 | Rim |
| 6,828,214 B2 | 12/2004 | Notsu |
| 6,828,628 B2 | 12/2004 | Hergenrother et al. |
| 6,831,292 B2 | 12/2004 | Currie et al. |
| 7,115,920 B2 | 10/2006 | Bernstein et al. |
| 2001/0009784 A1 | 7/2001 | Ma et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2005/0093067 A1* | 5/2005 | Yeo et al. .................... 257/348 |
| 2005/0130358 A1 | 6/2005 | Chidambarrao et al. |
| 2006/0177998 A1* | 8/2006 | Lin et al. .................... 438/585 |
| 2007/0132053 A1* | 6/2007 | King et al. .................. 257/499 |

FOREIGN PATENT DOCUMENTS

| | | |
|---|---|---|
| EP | 01/162362 | 6/1989 |
| EP | 0 967 636 A2 | 12/1999 |
| EP | 1 174 928 A1 | 1/2002 |
| WO | WO 94/27317 | 5/1993 |
| WO | WO 02/45156 A2 | 6/2002 |

OTHER PUBLICATIONS

Rim, et al. "Characteristics and Device Design of Sub-100 nm Strained Si N- and PMOSFETs", 2002 Symposium on VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC): A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp. 151-154, 2000 IEEE.

Sayama et al., "Effect of <Channel Direction for High Performance SCE Immune pMOSFET with Less Than 0.15um Gate Length"ULSI Development Center, pp. 27.5.1-27.5.4, 1999 IEEE.

Yin, et al., "Fully-depleted Strained-Si on Insulator NMOSFETs without Relaxed SiGe Buffers", IEDM, 2003 IEEE.

Yin, et al., "Strain partition of Si/SiGe and $SiO_2$/SiGe on compliant substrates", Applied Physics Letters, vol. 82, No. 22, Jun. 2, 2003, pp. 3853-3855.

Huang, et al., "Relaxation of a Strained Elastic Film on a Viscous Layer", Mat. Res. Soc. Symp. Proc., vol. 695, 2002 Materials Research Society; pp. L3.14.1-L3.14.6.

Yin, et al., "Strain relaxation of SiGe islands on compliant oxide", Journal of Applied Physics, vol. 91, No. 12, Jun. 15, 2002, pp. 9716-9722.

"AmberWave and Aixtron to develop CVD equipment for SiGe and strained Si", http://www.compoundsemiconductor.net/articles/news/6/5/13/1, last printed.

* cited by examiner

GATE ELECTRODE STRESS CONTROL FOR FINFET PERFORMANCE ENHANCEMENT

FIELD OF THE INVENTION

The invention relates generally to physical stress within semiconductor structures. More particularly, the invention relates to physical stress induced charge carrier mobility modification within semiconductor structures, including at least one finFET.

DESCRIPTION OF THE RELATED ART

Recent advances in semiconductor device design and development have involved the introduction of applied physical stress into semiconductor device components. Applied physical stress often leads to charge carrier mobility modification. In particular, enhanced charge carrier mobility generally leads to enhanced semiconductor device performance.

There are various examples of stress induced performance enhancement within semiconductor devices. For example, Chidambarrao et al., in U.S. Publication No. 2005/0130358 teaches a method for forming complementary finFET devices of complementary stress levels within a semiconductor structure. The method employs separate base materials as substrates for silicon epitaxial fin sidewall channel layer formation within the complementary finFET devices.

Other examples of compressive stress or tensile stress within various locations within semiconductor structures are alternatively known to provide charge carrier mobility modification. Typically, n-FET and p-FET devices respond differently to compressive and tensile stresses since piezoresistance coefficients will typically differ as a function of several variables, including but not limited to: semiconductor substrate doping and crystallographic orientation. Thus, stressed structures within n-FET and p-FET devices often need to be specifically engineered and optimized.

A trend within semiconductor design and development is for continued enhanced performance at smaller dimensions. Thus, a need will continue to exist for novel structures and methods that, in turn, provide semiconductor devices with enhanced performance. To that end, the use of physically stressed structures in semiconductor devices is likely to continue. Desirable are alternative semiconductor devices and methods for fabrication that advantageously use physical stress for semiconductor device performance enhancement.

SUMMARY OF THE INVENTION

The present invention provides a finFET structure having enhanced performance. The invention also provides a method for fabricating the structure.

In accord with the invention, the semiconductor structure comprises a substrate that includes at least one semiconductor fin having a crystallographic orientation and an axially specific piezoresistance coefficient. The structure also comprises a gate electrode covering a channel region within the semiconductor fin. Within the structure, the gate electrode and channel region have specific stresses that correlate with the axially specific piezoresistance coefficient.

Also in accord with the invention, the method first provides a substrate in which at least one semiconductor fin is located thereon. The method also provides for forming a gate electrode over a channel region in the semiconductor fin. Within the method, the gate electrode is formed with an intrinsic stress determined to influence charge carrier mobility within the channel region.

An embodiment of the invention is directed towards the semiconductor fin being a silicon semiconductor fin etched from a silicon surface having a (001) orientation. This yields a silicon semiconductor fin with crystallographic orientations as follows: longitudinal (110); transverse (001); and vertical (1-10). In accordance with the intrinsic piezoresistance coefficients for those silicon crystallographic orientations, the invention provides that a gate electrode is desirably formed with an intrinsic tensile stress of from about 500 to about 1500 megapascals (MPa), and more preferably from about 1200 to about 1500 MPa. Such intrinsic tensile stresses optimize charge carrier mobilities within the semiconductor fin channel region.

The invention is not limited to the disclosed embodiment. Rather, a person skilled in the art may readily investigate alternative crystallographic orientations and semiconductor materials compositions for a semiconductor fin to ascertain piezoresistance coefficients. On the basis of those piezoresistance coefficients, a particular intrinsic gate stress may be derived to optimize charge carrier mobility within a semiconductor fin channel region within a semiconductor device. The semiconductor device may be a finFET device, but the invention is not so limited.

DESCRIPTION OF THE PREFERRED EMBODIMENT

The invention provides a finFET structure and a method for fabrication thereof. The structure and method employ a gate electrode formed of a material having an intrinsic stress determined to influence (and preferably optimize) charge carrier mobility within a semiconductor fin channel region of the finFET structure. The charge carrier mobility determination involves analysis of magnitudes and dimensions of axially specific intrinsic piezoresistance coefficients for particular crystallographic orientations of the semiconductor fin. The intrinsic stress yields axially specific stresses (in the gate electrode and channel region) that correlate with (and preferably complement) the axially specific piezoresistance coefficients.

As will be seen from the embodiment and example that follows, for a semiconductor fin formed from a (001) monocrystalline silicon surface, a gate electrode with an intrinsic tensile stress of from about 500 to about 1500 MPa is desirable. When employing such an intrinsic tensile stress within the gate electrode, the semiconductor fin channel region has an enhanced tensile vertical stress and an enhanced compressive transverse stress induced therein by the gate electrode. The foregoing types of induced stresses (i.e., tensile and compressive) within the channel region are both beneficial to an n-finFET. The enhanced tensile vertical stress is also beneficial to a p-finFET, which is not appreciably influenced by the enhanced compressive transverse stress.

As is understood by a person skilled in the art, a semiconductor "fin" as utilized in the invention is intended as a comparatively narrow (i.e., about 0.01 to about 0.30 microns, and preferably about 0.01 to about 0.03 microns) semiconductor material layer set edgewise upon a substrate. The fin may optionally have a dielectric capping layer that may also enhance its physical stability.

Within a "finFET" device at least the sidewalls of the semiconductor fin, and sometimes also the top of the semiconductor fin, are utilized as a channel region. The channel region is generally covered by an "n" shaped gate electrode that straddles the semiconductor fin, although a finFET gate electrode is not specifically limited to such a shape.

A finFET provides advantage in comparison with a conventional planar field effect transistor insofar as the finFET provides excellent short channel effects due to a double gate effect. It also provides vertical sidewall channel regions while a conventional field effect transistor typically provides only planar horizontal channel regions. By increasing a height of a semiconductor fin formed upon a substrate, a finFET device of enhanced channel dimensions may be provided without compromising an aerial density of finFET devices. A similar advantage is not achievable with conventional planar field effect transistors. Generally, a semiconductor fin will have a channel length (longitudinal direction, defined by gate linewidth) and a channel width (transverse direction, defined by fin height and possibly thickness) that are each considerably greater than a minimum fin linewidth (vertical direction).

The following embodiment illustrates the invention within the context of a finFET that utilizes a silicon-on-insulator semiconductor substrate that provides a particular silicon semiconductor fin crystallographic orientation. The invention is not, however, so limited. The invention is applicable to finFET devices located upon bulk semiconductor substrates as well as other semiconductor-on-insulator substrates. The invention is also applicable to finFETs formed from other semiconductor materials, such as, but not limited to silicon-germanium alloy and compound semiconductor materials, that exhibit a crystallographic axis dependent piezoresistance effect.

FIG. 1 to FIG. 4 show a series of schematic cross-sectional diagrams illustrating the results of progressive stages in fabricating a finFET structure in accordance with an embodiment of the invention.

Figure 1:
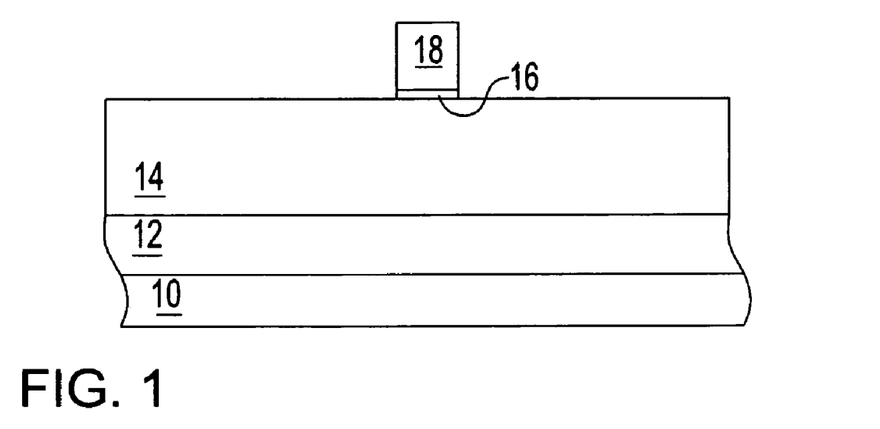
FIG. 1 to FIG. 4 show a series of schematic cross-sectional diagrams illustrating the results of progressive stages in forming a finFET in accordance with an embodiment of the invention.

FIG. 1 shows a semiconductor substrate 10. A buried insulator layer 12 is located upon the semiconductor substrate 10. The buried insulator layer 12 may be a crystalline or non-crystalline oxide or nitride, with oxides being highly preferred. A semiconductor surface layer 14 is located upon the buried insulator layer 12. The semiconductor surface layer 14 is typically a silicon semiconductor surface layer. In an aggregate, the foregoing three layers comprise a silicon-on-insulator semiconductor substrate. It may be formed utilizing conventional processes such as ion implantation and annealing (i.e., a SIMOX process) or by a layer transfer process. The semiconductor substrate 10 is typically a silicon semiconductor substrate, although this is not required within the invention. In addition, the buried insulator layer 12 is typically a buried silicon oxide layer. The semiconductor surface layer 14 typically has a thickness from about 500 to about 2000 angstroms, which thickness can be a direct result of the process used in fabricating the substrate or by employing a thinning step such as oxidation and etching.

FIG. 1 also shows a pad dielectric layer 16 located upon the semiconductor surface layer 14, and a hard mask layer 18 located aligned upon the pad dielectric layer 16.

Typically, the pad dielectric layer 16 has a thickness from about 25 to about 150 angstroms. It may comprise a silicon oxide material. Such a silicon oxide material is typically formed incident to thermal oxidation of the semiconductor surface layer 14 when it comprises a silicon material. Although thermal oxidation can be used in forming the pad dielectric layer 14, a conventional deposition process such as CVD, PECVD or evaporation can alternatively be employed.

Typically the hard mask layer 18 comprises a hard mask material such as a silicon nitride or silicon oxynitride. Other hard mask materials may alternatively be utilized. It is typically has a thickness from about 500 to about 1000 angstroms.

Figure 2:
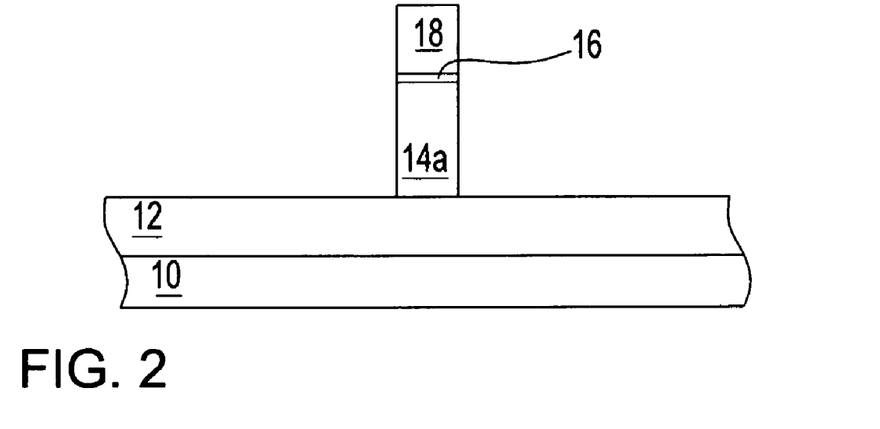

FIG. 2 shows the results of generally conventional processing known as "sidewall image transfer" that provides for anisotropically etching the semiconductor surface layer 14 to form a semiconductor fin 14a. The hard mask layer 18 and the pad dielectric layer 16 are utilized as a mask and the buried insulator layer 12 is utilized as an etch stop layer. The etching is typically undertaken utilizing a plasma etchant employing a chlorine containing etchant gas composition. Although plasma etching is specifically mentioned, the semiconductor fin 14a can be formed utilizing other dry etching processes such as, for example, reactive-ion etching or ion beam etching.

Figure 3:
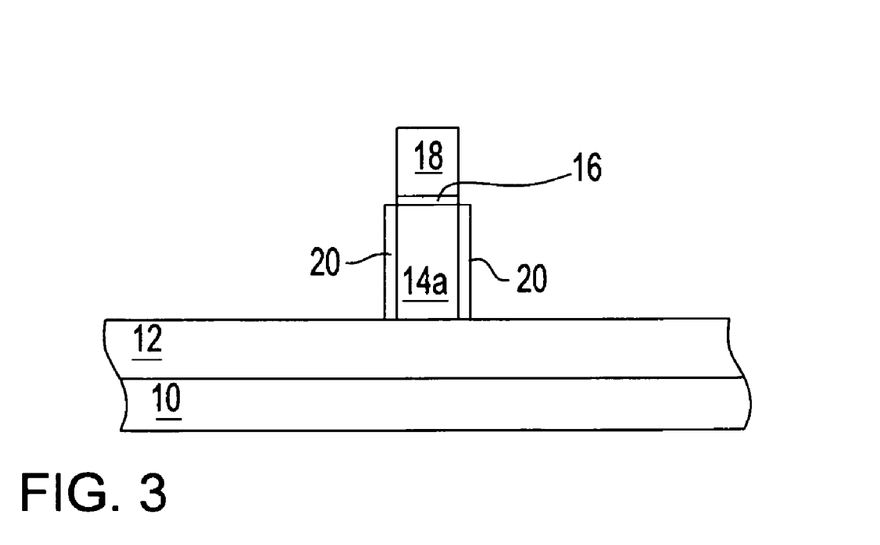

FIG. 3 shows a pair of gate dielectric layers 20 located upon opposite sidewalls of the semiconductor fin 14a. Typically the gate dielectric layers 20 comprise a thermal silicon oxide material. It may be formed incident to thermal oxidation of the semiconductor fin 14a when it comprises a silicon semiconductor material. Although, thermal silicon oxide is specifically mentioned as the gate dielectric material, the present invention also contemplates utilizing oxides, nitrides, oxynitrides, or combinations thereof formed by conventional thermal and/or deposition techniques well known in the art. Preferably, oxides having a dielectric constant, as measured in a vacuum, of about 4.0 or greater are used as the dielectric material. Typically, each of the pair of gate dielectric layers 20 has a thickness from about 10 to about 70 angstroms.

Figure 4:
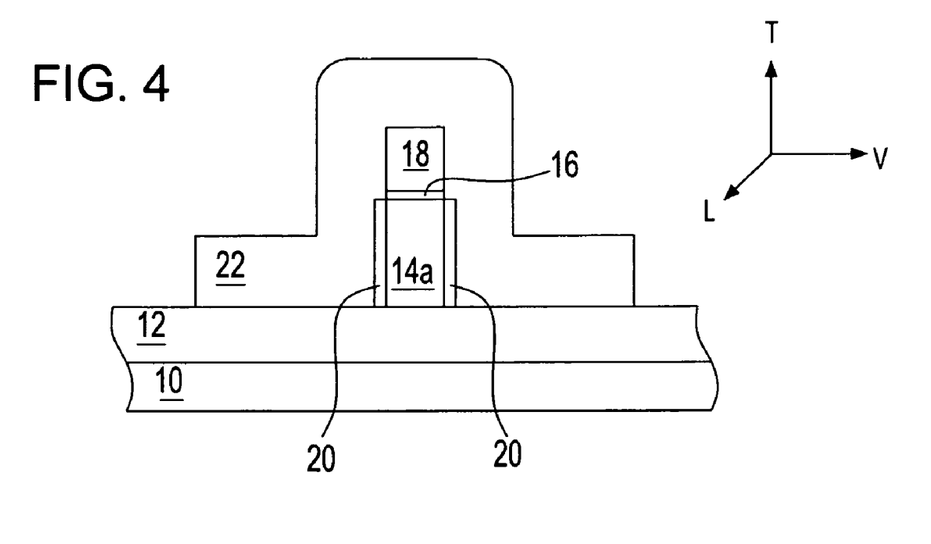

FIG. 4 shows a gate electrode 22 located upon the finFET structure illustrated in FIG. 3. The gate electrode 22 has a modified "n" shape that straddles the semiconductor fin 14a. The gate electrode 22 is typically comprises a highly doped polysilicon material (i.e., 1e20 to 1e21 dopant atoms per cubic centimeter). It has a thickness from about 1000 to about 2000 angstroms. In addition to doped polysilicon, the present invention also contemplates other conductive materials such as doped polySiGe, elemental metals, alloys of elemental metals, metal silicides, metal nitrides or combination thereof as the gate electrode 22 material. In accordance with the invention, the gate electrode 22 has an intrinsic stress that provides for charge carrier mobility influence (preferably enhancement or optimization) within a channel region of the semiconductor fin 14a. The channel region of the semiconductor fin 14a is that portion of the semiconductor fin 14a covered by the gate electrode 22. It is show in greater detail in FIG. 5, as discussed in greater detail below.

Several variables are understood within the semiconductor fabrication art to influence intrinsic stress within deposited films such as but not limited to polysilicon films. Specific variables are taught within: (1) Heuer et al., in U.S. Pat. No. 6,479,166 (columnar polysilicon films having tensile stress and devitrified polysilicon films having compressive stress); and (2) Yamazaki et al., in U.S. Pat. No. 6,645,826 (silicon nitride films having variable stress dependent upon deposition rate). Common thin film deposition parameters that affect deposited film stress may include, but are not limited to: deposition temperature (i.e., to yield stress as a result of a mis-match of substrate and deposited film coefficients of thermal expansion), deposited film starting materials, deposited film crystallinity, deposited film composition and deposition rate. Other thin film deposition parameters may also influence deposited layer stress.

FIG. 4 also illustrates the reference coordinate axes for the semiconductor fin 14a. They differ from reference coordinate axes for a standard FET formed upon a planar semiconductor substrate. The vertical axis emanates from the plane of the sidewall of the semiconductor fin 14a. The transverse axis emanates from the plane of the top of the semiconductor fin 14a. The longitudinal axis emanates from the plane of the face of the semiconductor fin 14a cross-section as illustrated in FIG. 4.

Figure 5:
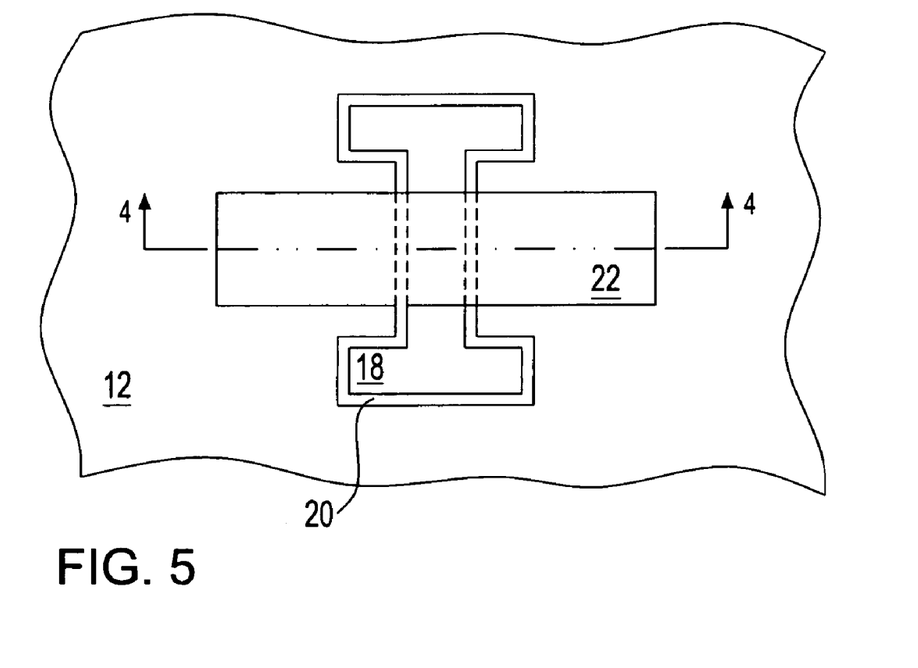
FIG. 5 shows a schematic plan-view diagram corresponding with the schematic cross-sectional diagram of FIG. 4.

FIG. 5 shows a schematic plan-view diagram corresponding with the schematic cross-sectional diagram of FIG. 4. FIG. 5 shows exposed portions of the buried insulator layer 12 for the finFET device of the disclosed embodiment. Also illustrated is an outline of the gate dielectric layer 20 that encloses the semiconductor fin 14a aligned beneath the hard mask layer 18. The semiconductor fin 14a has a shape of a dog bone (i.e., a structure having an axial central portion and lobed end portions of linewidth greater than the axial central portion). The gate electrode 22 perpendicularly traverses the semiconductor fin 14a at its center between the lobed ends of the dog bone shape. A channel region of the semiconductor fin 14a is located beneath the gate electrode 22. A pair of opposite end portions of the semiconductor fin 14a uncovered by the gate electrode 22 is employed as a pair of source/drain regions. They are typically subjected to further ion implantation while employing the gate electrode 22 as a mask, possibly after selectively etching therefrom overlying portions of the hard mask layer 18. Large angle tilt implant methods may also be utilized to provide for a more uniform dopant distribution profile within the source/drain regions.

Although not specifically illustrated through use of additional figures, the instant embodiment of the invention contemplates additional processing of the finFET structure of FIG. 5 to provide for its integration into particular circuits. For example, the gate dielectric layer 20 may be stripped from portions of the semiconductor fin 14a not covered by the gate electrode 22 to allow for spacers to be formed adjacent the semiconductor fin 14a. In addition, full integration of the finFET of the instant embodiment into a particular circuit of necessity also requires contact structures. The embodiment contemplates the foregoing additional processing and additional structures.

An embodiment of the invention focuses on a semiconductor fin 14a that may be formed from a bulk silicon semiconductor substrate or a silicon surface layer within a silicon-on-insulator semiconductor substrate, either having a (001) surface orientation. Either provides the semiconductor fin 14a of a single semiconductor material. In accordance with FIG. 4, crystallographic orientations for the semiconductor fin 14a so formed are: longitudinal (110); transverse (001); and vertical (1-10).

The intrinsic piezoresistance coefficients for a silicon semiconductor fin with the foregoing crystallographic orientations for both n and p silicon are as follows (units are e-11/pascal). For n silicon the longitudinal, vertical and transverse piezoresistance coefficients are −31.6, −17.6 and 53.4. For p silicon the longitudinal, vertical and transverse piezoresistance coefficients are 71.8, −66.3 and −1.1.

Thus, axial stresses applied to a silicon semiconductor fin 14a of the above crystallographic orientations and doping to yield maximum charge carrier mobility benefit are as follows. For n silicon, a compressive transverse stress provides maximum advantage, followed by a tensile longitudinal stress and finally a tensile vertical stress. For p silicon, a compressive longitudinal stress and a tensile vertical stress are most relevant. There is little piezoresistive effect in the transverse direction for a p silicon semiconductor fin.

The disclosed embodiment seeks to optimize stress (and thus charge carrier mobility) within a semiconductor fin channel region within a finFET device. This is achieved within the context of the foregoing piezoresistance coefficients by appropriately modifying intrinsic stress within a gate electrode of the finFET device to provide desirable axially specific stresses within the gate electrode as deposited. The axially specific stresses within the gate electrode transfer into the semiconductor fin channel region. To achieve the result, the gate electrode intrinsic stress is selected to provide a deposited gate electrode with stress that correlates with and preferably complements piezoresistance coefficients in a semiconductor fin channel region.

Within the instant embodiment, the longitudinal piezoresistive coefficients for n and p silicon are of opposite sign. Thus, if a gate electrode as deposited imparts one of a longitudinal compressive stress and a longitudinal tensile stress to a semiconductor fin, there will of necessity be an offset of an electron mobility effect and a hole mobility effect in the longitudinal direction for the channel region. Thus, the instant embodiment does not contemplate a longitudinal charge carrier mobility enhancement. Since the vertical piezoresistive coefficients for both the n silicon and p silicon are negative, a tensile vertical stress will contribute to vertical charge carrier mobility enhancement within both n-finFET and p-finFET devices. Since the transverse piezoresistive coefficient is highly positive for n silicon and approximately zero for p silicon, a compressive transverse stress will enhance electron charge carrier mobility within an n-finFET device while not appreciably influencing hole charge carrier mobility within a p-finFET device.

For the instant embodiment with the foregoing silicon semiconductor fin 14a crystallographic orientation, the invention provides that a gate electrode 22 deposited with an intrinsic tensile stress of from about 500 to about 1500 MPa and more preferably from about 1200 to about 1500 MPa assists in providing the above desirable axially induced stresses within the gate electrode 22 and the semiconductor fin 14a.

Figure 6:
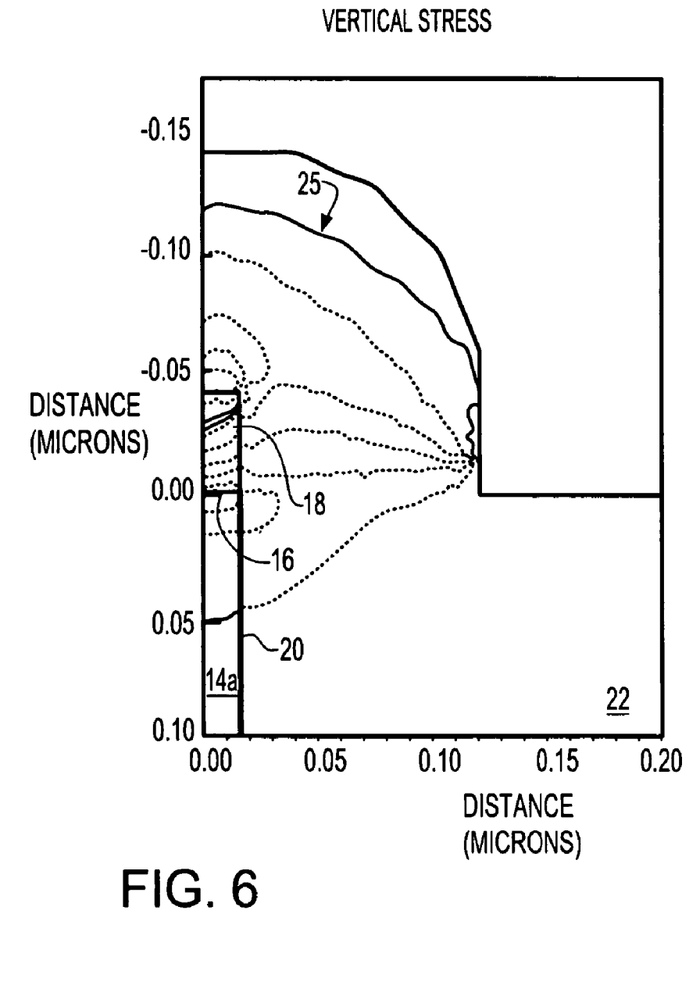
FIG. 6 and FIG. 7 show a pair of stress topography graphs for vertical stress and transverse stress within a finFET device incident to forming the finFET device with a gate electrode having an intrinsic tensile stress of 1500 MPa.

FIG. 6 shows a computer simulation stress topography graph for vertical stress within a finFET device in accordance with the invention. FIG. 6 shows the semiconductor fin 14a having the pad dielectric layer 16 and the hard mask layer 18 located aligned thereover. The gate dielectric layer 20 is located upon a sidewall of the semiconductor fin 14a. The gate electrode 22 covers the hard mask layer 18, the pad dielectric layer 16, the semiconductor fin 14a and the gate dielectric layer 20. The vertical stress topography diagram of FIG. 6 assumes that all other components of the finFET device have a conventional modulus and have no intrinsic stress, but that the gate electrode 22 is deposited with a fixed intrinsic tensile stress of 1500 MPa.

Several semiconductor structure variables influence a computer simulation stress topography graph, such as illustrated in FIG. 6. Such variables include, but are not limited to: dimensions, modulus and intrinsic stress of components, including the semiconductor fin and the gate electrode. Differences and variations of each of the variables is expected to influence stress contour profiles as illustrated in both FIG. 6 and FIG. 7.

Reference numeral 25 within FIG. 6 designates the zero stress line within the gate electrode 22. Above the zero stress line is the physical boundary of the gate electrode 22. Below the zero stress line are tensile stress contours increasing in increments of 200 MPa. Although FIG. 6 is clearly limited to the materials properties (i.e., dimensions, modulus and stress) limitations as provided above, FIG. 6 also clearly shows that a tensile vertical stress may be induced into the semiconductor fin 14a from a gate electrode 22 deposited with an intrinsic tensile stress of about 1500 MPa.

Figure 7:
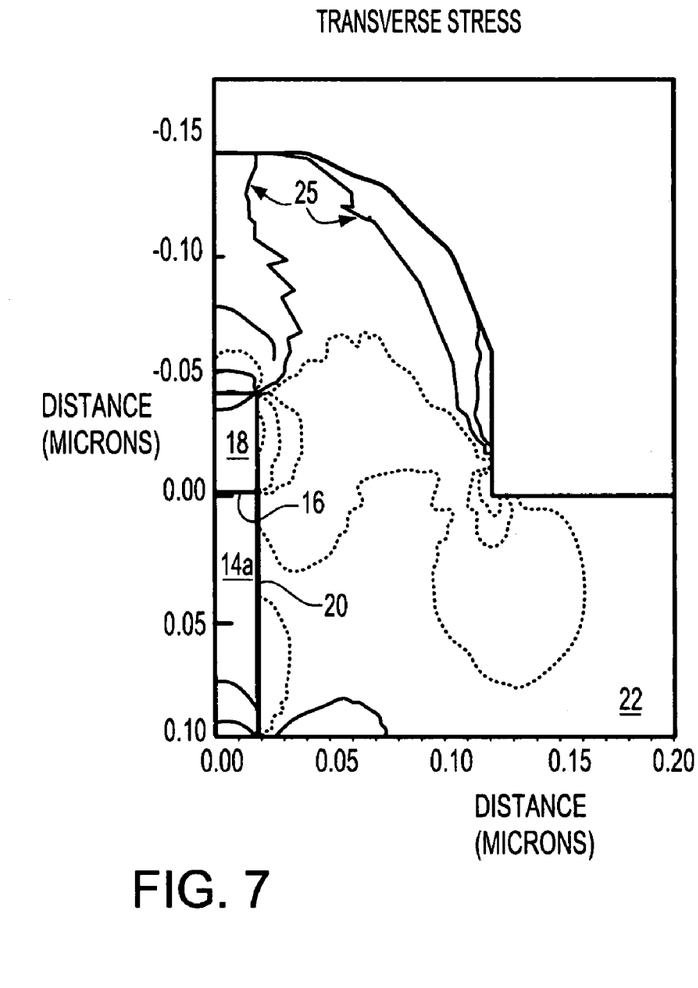

FIG. 7 shows a stress topography graph analogous to the stress topography graph of FIG. 6, but for stress in a transverse direction rather than a vertical direction. The finFET components, as illustrated in FIG. 7, are the same as the finFET components as illustrated in FIG. 6. The components are still assumed to have no intrinsic stress and conventional module. The gate electrode 22 is still formed with an intrinsic tensile stress of about 1500 MPa.

Reference numerals 25 within FIG. 7 shows a pair of zero stress lines that define a small zero stress region. Remaining lines beneath the zero stress lines are compressive stressed, and also defined in increments of 200 MPa per compressive stress topography line. FIG. 7 clearly shows that considerable transverse compressive stress is induced into a semiconductor fin 14a channel region in accord with the embodiment of the invention, when a gate electrode having an intrinsic tensile stress of about 1500 MPa is deposited thereover.

Figure 8:
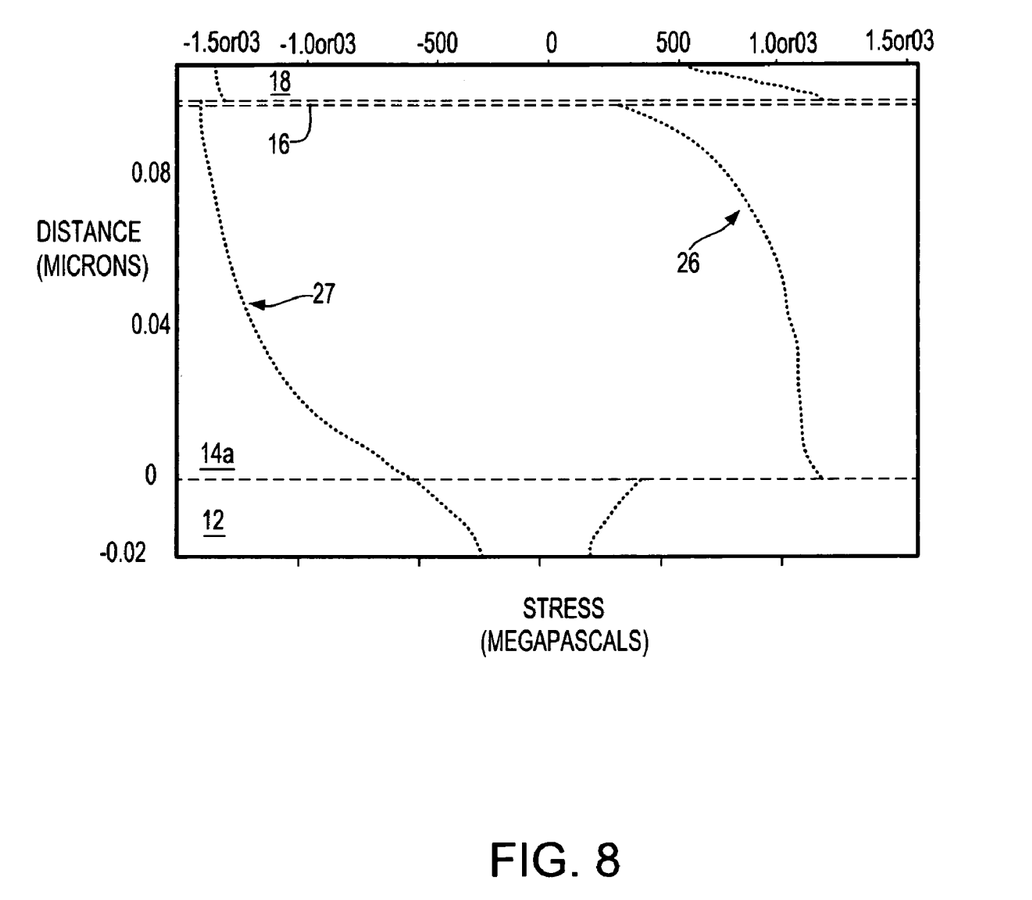
FIG. 8 shows a graph of transverse stress and vertical stress within a semiconductor fin within a finFET device, to summarize the information provided within FIG. 6 and FIG. 7.

FIG. 8 shows a stress topography graph that summarizes and amplifies the stress topography data of FIG. 6 and FIG. 7.

FIG. 8 shows the buried insulator layer 12 as a part of an SOI substrate layer. The semiconductor fin 14a is located upon the buried insulator layer 12. The pad dielectric layer 16 is located upon the semiconductor fin 14a and the hard mask layer 18 is located upon the pad dielectric layer 16.

Reference numeral 26 shows a vertical stress profile line through the height of the semiconductor fin 14a. It has a tensile stress ranging from about 300 to about 1200 MPa and generally averaging about 900 MPa. Reference numeral 27 shows a corresponding transverse stress profile through the height of the semiconductor fin 14a. It has a compressive stress that ranges from about −500 to about −1500 MPa and generally averaging about −1150 MPa.

Charge carrier mobility enhancement (as a percentage versus baseline) is calculated as a negative sum for the longitudinal, transverse and vertical directions of the product of an applied stress in a crystallographic plane (units may be pascals) times a piezoresistance coefficient for the crystallographic plane (units may be 1/pascals). The equation is as follows:

$$d\mu/\mu = -(\pi_l \sigma_l + \pi_v \sigma_v + \pi_t \sigma_t)$$

$d\mu/\mu$ equals charge carrier mobility enhancement. $\pi_l$, $\pi_v$ and $\pi_t$ are piezoresistance coefficients in the l, v and t directions. $\sigma_l$, $\sigma_v$ and $\sigma_t$ are axially specific stress levels also in the l, v and t directions.

For the disclosed embodiment with respect to an n-finFET, the calculation when considering vertical and transverse stress is as follows:

$$-(-17.6e-11 * 900e6 + 53.4e-11 * -1150e6) = 77\%$$

For the disclosed embodiment with respect to a p-finFET, the calculation when considering vertical stress only (since the transverse piezoresistance coefficient is negligible) is as follows:

$$-(-66.3e-11 * 900e6) = 60\%$$

The foregoing calculations suggest considerable charge carrier mobility enhancement within both n- and p-finFETs in accord with the disclosed embodiment. The mobility enhancements are due to appropriate gate electrode induced stresses within a semiconductor fin channel region within the finFETs.

As noted above, the present invention is not limited to the foregoing embodiment that discloses a particular silicon semiconductor fin crystallographic orientation and doping. Rather, the invention may employ other semiconductor fins formed of other crystallographic orientations and materials compositions. Such other semiconductor fins will have axially specific intrinsic piezoresistance coefficients that may be evaluated in accord with the invention. Incident to such evaluation, an intrinsic stress for a gate electrode may be determined such as to influence and optimize charge carrier mobility within the context of the intrinsic piezoresistance coefficients.

The preferred embodiment of the invention is illustrative of the invention rather than limiting of the invention. Revisions and modifications may be made to methods, materials, structures and dimensions in accord with the preferred embodiment of the invention while still providing an embodiment in accord with the invention, further in accord with the accompanying claims.

What is claimed is:

1. A method for fabricating an n-finFET device comprising:
providing a substrate including at least one semiconductor fin having a crystalline orientation of longitudinal (110), transverse (001) and vertical (1-10); and
forming a gate electrode over a channel region within the at least one semiconductor fin, where the gate electrode comprises a gate electrode material that is deposited using a deposition method that provides the gate electrode with an intrinsic stress of a magnitude and being of a compressive transverse stress to increase charge carrier mobility within the channel region of the n-finFET device.

2. The method of claim 1 wherein the at least one semiconductor fin comprises a monocrystalline semiconductor material.

3. The method of claim 2 wherein the at least one semiconductor fin comprises a silicon semiconductor material.

4. The method of claim 3 wherein the at least one semiconductor fin is formed in a bulk silicon semiconductor substrate.

5. The method of claim 3 wherein the at least one semiconductor fin is formed in a silicon-on-insulator semiconductor substrate.

6. The method of claim 5 wherein the at least one semiconductor fin is located upon a buried insulator layer of the silicon-on-insulator semiconductor substrate.

7. The method of claim 1 wherein the intrinsic stress in the gate is from about 500 to about 1500 MPa tensile stress.

8. The method of claim 1 wherein the intrinsic stress in the gate is from about 1200 to about 1500 MPa tensile stress.

9. A method for fabricating a p-finEET device comprising:
providing a substrate including at least one semiconductor fin having a crystalline orientation of longitudinal (110), transverse (001) and vertical (1-10); and
forming a gate electrode over a channel region within the at least one semiconductor fin, where the gate electrode comprises a gate electrode material that is deposited using a deposition method that provides the gate electrode with an intrinsic stress of a magnitude and being of at least one of a compressive longitudinal stress and tensile vertical stress to increase charge carrier mobility within the channel region of the p-finFET device.

10. The method of claim 9 wherein the at least one semiconductor fin comprises a monocrystalline semiconductor material.

11. The method of claim 9 wherein the at least one semiconductor fin comprises a silicon semiconductor material.

12. The method of claim 9 wherein the at least one semiconductor fin is formed in a bulk silicon semiconductor substrate.

13. The method of claim 9 wherein the at least one semiconductor fin is formed in a silicon-on-insulator semiconductor substrate.

14. The method of claim 9 wherein the at least one semiconductor fin is located upon a buried insulator layer of the silicon-on-insulator semiconductor substrate.

15. The method of claim 9 wherein the intrinsic stress in the gate is from about 500 to about 1500 MPa tensile stress.

16. The method of claim 9 wherein the intrinsic stress in the gate is from about 1200 to about 1500 MPa tensile stress.

* * * * *

UNITED STATES PATENT AND TRADEMARK OFFICE
CERTIFICATE OF CORRECTION

PATENT NO. : 7,655,511 B2  Page 1 of 1
APPLICATION NO. : 11/163908
DATED : February 2, 2010
INVENTOR(S) : Dureseti Chidambarrao It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 684 days.

Signed and Sealed this

Twenty-third Day of November, 2010

David J. Kappos
*Director of the United States Patent and Trademark Office*